United States Patent [19]

Guinet et al.

[11] Patent Number: 4,860,939

[45] Date of Patent: Aug. 29, 1989

[54] METHOD FOR BONDING A COPPER SHEET TO A SUBSTRATE MADE OF AN ELECTRICALLY INSULATING MATERIAL

[75] Inventors: Jannick Guinet, Montmorency; Jean-Claude Hubert, Sucy En Brie; Marie-Francoise Martial, Puteaux, all of France

[73] Assignee: La Telemecanique Electrique, France

[21] Appl. No.: 269,394

[22] Filed: Nov. 10, 1988

[30] Foreign Application Priority Data

Nov. 10, 1987 [FR] France ............................ 87 15547

[51] Int. Cl.$^4$ ............................................ C04B 37/02
[52] U.S. Cl. .................................... 228/122; 228/124; 228/193; 228/195; 228/263.12
[58] Field of Search .............. 228/122, 123, 124, 193, 228/194, 195, 263.12

[56] References Cited

U.S. PATENT DOCUMENTS

| | | | |
|---|---|---|---|
| 2,517,248 | 8/1950 | Semeyn | 220/69 |
| 3,517,432 | 6/1970 | Sandstrom | 228/193 |
| 3,911,553 | 10/1975 | Burgess et al. | 228/195 |
| 3,994,430 | 11/1976 | Cusano et al. | 228/122 |
| 4,050,956 | 9/1977 | de Bruin et al. | 228/122 |
| 4,505,418 | 3/1985 | Neidig et al. | 228/122 |
| 4,563,383 | 1/1986 | Kuneman et al. | 428/216 |
| 4,591,401 | 5/1986 | Neidig et al. | 228/122 |
| 4,693,409 | 9/1987 | Mizunoya et al. | 228/122 |

FOREIGN PATENT DOCUMENTS

| | | | |
|---|---|---|---|
| 0097944 | 1/1984 | European Pat. Off. | 228/122 |
| 0123212 | 10/1984 | European Pat. Off. | 228/122 |
| 3036128 | 4/1982 | Fed. Rep. of Germany | 228/122 |
| 3204167 | 8/1983 | Fed. Rep. of Germany | 228/122 |
| 3324661 | 1/1985 | Fed. Rep. of Germany | 228/122 |
| 2181049 | 11/1973 | France | 228/122 |
| 202198 | 4/1939 | Switzerland | 228/122 |
| 584931 | 1/1947 | United Kingdom | 228/122 |
| 761045 | 11/1956 | United Kingdom | 228/122 |

OTHER PUBLICATIONS

Patent Abstracts of Japan, vol. 9, No. 318, 12-1985, JP-A-60 150 653, Toshiba KK, 8-1985.

Primary Examiner—Nicholas P. Godici
Assistant Examiner—Samuel M. Heinrich
Attorney, Agent, or Firm—William A. Drucker

[57] ABSTRACT

Disclosed is a method for the direct bonding of a copper sheet to a substrate made of an electrically insulating material, with the heating of the copper/substrate set in order to obtain a eutectic mixture. The method according to the invention consists in cleaning the copper to eliminate traces of oxidation on its surface before placing said copper on the substrate, in heating the copper/substrate set under a neutral atmosphere until a temperature greater than the temperature for the formation of the eutectic mixture is reached, and in applying the oxidating reactive gas only after the temperature greater than the temperature for the formation of the eutectic mixture is reached, in such a way that this temperature is reached before any oxidation of the surface of the copper.

12 Claims, 1 Drawing Sheet

U.S. Patent    Aug. 29, 1989    4,860,939
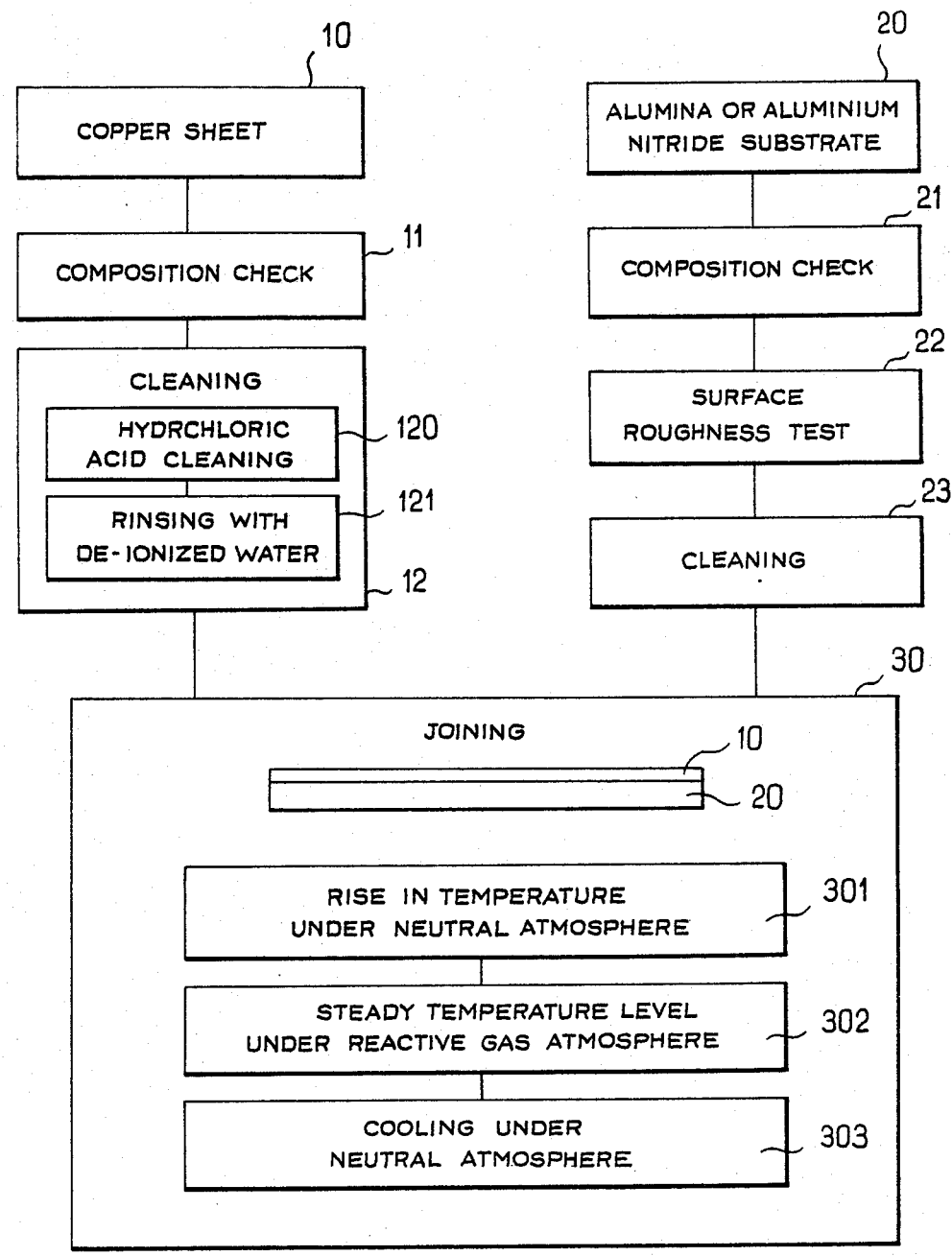

METHOD FOR BONDING A COPPER SHEET TO A SUBSTRATE MADE OF AN ELECTRICALLY INSULATING MATERIAL

BACKGROUND OF THE INVENTION

1. Field of the Invention

The present invention concerns the bonding of a copper sheet to a substrate made of an electrically insulating material.

The present invention can be applied, notably, to the making of electronic power modules using a substrate made of electrically insulating material chosen from among alumina and aluminum nitride.

The making of electronic power modules requires the use of materials with high galvanic insulation and thermal conduction properties. Furthermore, the materials used should have an expansion coefficient close to that of the semiconducting materials used such as silicon. Moreover, it is clearly desirable for the materials forming the above-mentioned modules to be as inexpensive as possible.

2. Description of the Prior Art

Numerous processes have already been proposed for bonding a copper sheet to a substrate made of an electrically insulating material.

The documents U.S. Pat. No. 2,517,248 and GB-A-584 931 teach, for example, a method for bonding a metal sheet to a substrate, made of electrically insulating material, by using a soldering material placed between the metal sheet and the substrate. However, the formation of a layer based on soldering material between the metal sheet and the substrate does not give sets with the physical characteristics (expansion coefficient and thermal conductivity) required for the designing of electronic power modules.

The documents U.S. Pat. No. 3,517,432, CH-A 202 198 and GB- A-584 931 teach, for example, a method for bonding a metal sheet to a substrate, made of electrically insulating material, by using a soldering material placed between the metal sheet and the substrate. However, the formation of a layer based on soldering material between the metal sheet and the substrate does not give sets with the physical characteristics (expansion coefficient and thermal conductivity) required for the designing of electronic power modules.

The documents U.S. Pat. No. 3,517,432, CH-A 202 198 and GB-A-761 045 teach a methods for bonding a metal sheet to a substrate by heating the material above its melting point in order to obtain a diffusion of the metal in the substrate and, thereby, a mechanical bonding between these elements. It is noted, however, that, after melting, the metal generally loses its integrity and tends to break up into metallic droplets The result thereof is that the metal/substrate set does not have the physical characteristics required to make electronic power modules.

The documents EP-A-0 097 944 et EP-A-0 123 212 teach the making of a bond of a metal sheet with a substrate made of electrically insulating material through the initial formation of a bonding layer, for example by heat treatment, on the electrically insulating substrate. The sets thus obtained do not have the requisite physical characteristics for making electronic power modules.

It has, furthermore, been proposed to bond a copper sheet with a substrate made of an electrically insulating material by the formation of a eutectic material.

Thus, the document FR-A-2 181 049 teaches the placing of a copper sheet on a substrate made of an electrically insulating material, the heating of this set under a reactive gas atmosphere at a temperature ranging between the temperature for forming a eutectic mixture and the melting temperature of copper, and then the cooling of the set. The documents U.S. Pat. Nos. 3,994,430, 3,911,553, DE-A-3 036 128 and DE-A-3 204 167 propose a pre-oxidation of the metal sheet before placing it on the electrically insulating material and the heating of the set thus obtained under a controlled atmosphere at a temperature ranging between the temperature for forming a eutectic mixture and the temperature for the melting of copper.

The processes proposed until now for bonding a metal sheet to a substrate made of an electrically insulating material, with the formation of a eutectic mixture, have been very useful. However, these processes are not entirely satisfactory. For, a detailed analysis reveals that there are air bubbles present at the metal/substrate interface. The presence of these air bubbles is a local obstacle to any mechanical bonding between the metal and the substrate. Furthermore, these air bubbles enable diffusion, with adverse effects, of etching agents between the metal and the insulating substrate when metallic pads, in a pattern geared to a specific purpose, are obtained by elimination.

It has been attempted to remove the air bubbles thus revealed by making grooves, used as discharge channels, in the surface of the metallic sheet as described, for example, in the document DE-A-33 24 661. It would seem that grooves of this type effectively make it possible to limit the formation of air bubbles at the metal/substrate interface. However, the above-mentioned grooves favor the harmful diffusion of etching agents between the metal sheet and the substrate.

In conclusion, hitherto proposed techniques for bonding a copper sheet to a substrate made of electrically insulating material are not entirely satisfactory.

After numerous essays and a great deal of research, the Applicant has determined that the pre-oxidation of the metal sheet, hitherto acknowledged as being indispensable before obtaining a temperature greater than the temperature for the formation of a eutectic mixture (pre-oxidation obtained through the application of a reactive atmosphere during the rise in temperature according to the document FR-A-2 181 049 or obtained by controlled pre-oxidation before heat treatment according to the documents U.S. Pat. Nos. 3,994,930, 3,991,553, DE-A-3 036 128 and DE-A-3 204 167) was in fact responsible for the formation of the above-mentioned air bubbles. Furthermore, in going against these received ideas, the Applicant has determined, after a great deal of testing and research, that an entirely satisfactory copper/substrate bond, meeting the physical characteristics required to make electronic power modules, can be obtained without pre-oxidizing the metal sheet.

SUMMARY OF THE INVENTION

To this end, the Applicant proposes a method, within the framework of the present invention, for the direct bonding of a copper sheet to a substrate made of electrically insulating material chosen from among alumina and aluminum nitride, said method consisting, in a manner known per se, in the placing of a copper sheet on the substrate and the heating of this set under a controlled atmosphere with the use, at least temporarily, of an oxidating reactive gas, at a temperature ranging between the temperature for the formation of a eutectic mixture, based on copper and the reactive gas, and the melting temperature of copper, and then in cooling the set, said method comprising the following steps:

i—cleaning the copper to remove traces of oxidation at its surface before placing it on the substrate, ii—heating the copper/substrate set under a neutral atmosphere until a temperature is obtained which is greater than the eutectic mixture forming temperature, and iii—applying the oxidating reactive gas only after the obtaining of a temperature greater than the temperature for the formation of the eutectic mixture in such a way that it is reached before any oxidation of the surface of the copper.

BRIEF DESCRIPTION OF THE DRAWING

Other features, aims and advantages of the present invention will appear from the following description, with reference to the appended drawing in which the single FIGURE schematically shows the various steps for the implementation of the bonding method according to the present invention.

DESCRIPTION OF A PREFERRED EMBODIMENT

As shown schematically in the appended FIGURE, an aim of the method according to the invention is to bind a copper sheet 10 to a substrate 20 made of alumina or aluminum nitride. As a non-restrictive example, the copper sheet may have a thickness of about 0.3 mm. and the alumina may have a thickness of about 0.635 mm.

Within the framework of the invention, it is firstly necessary to check the composition of the copper sheet. This checking step is shown schematically in the appended FIGURE, under the reference 11.

For, the Applicant has determined that the presence of phosphorus in the copper sheet 10 is opposed to the formation of an efficient copper/substrate bond.

More precisely again, the Applicant has determined that an optimum copper/substrate bond is obtained with a phosphorus content of below 0.0015%. Furthermore, it is considerably preferable to use a copper sheet 10 with an oxygen content ranging between 0.0020% and 0.0024% by weight.

Finally, the Applicant has determined that it is desirable to use a copper sheet 10 of the annealed type with a hardness ranging between 43 and 45 HV.

The copper sheets 10 meet the characteristics defined during the checking stage 11 and are subjected to a cleaning process 12.

Preferably this cleaning step 12 can be divided into a prior stage of cleaning in a solution diluted with hydrochloric acid, marked 120 in the appended FIGURE, and a following stage of rinsing in de-ionized water, marked 121 in the appended FIGURE.

At the same time, the substrates 20 are subjected to a checking stage 21. For, the Applicant has determined that, to obtain an optimum copper/substrate bonding, it is desirable to use alumina or aluminum nitride substrates with a content of transition metal oxides, notably iron oxide $Fe_2O_3$, of less than 0.08% by weight.

Subsequently, the substrates meeting the criteria laid down during the composition checking stage 21 are subjected to a surface roughness test 22.

For, the Applicant has determined that to obtain an optimum copper/substrate bond, it is desirable to use alumina or aluminum nitride substrates 20 having a surface roughness in the range of $3.3 \pm 2.10^{-7}$ m.

The alumina or aluminum nitride substrates 20 that meet the criteria of the surface roughness check 22 are subjected to a cleaning process 23. A cleaning process of this type, which is standard per se, shall not be described in greater detail in the rest of the description.

The copper sheets 10 and the substrates thus selected and cleaned are available for the joining process 30 proper. For this, the sheets 10 coming from the cleaning process 12 are placed directly on a substrate 20 coming from the cleaning process 23. The joining stage 30 can be divided into three consecutive elementary steps: a rise in temperature 301, a steady temperature level 302 and a cooling stage 303.

The rise in temperature 301 is achieved under neutral atmosphere, preferably of nitrogen. The temperature rising stage 301 under neutral atmosphere is continued until a temperature greater than the theoretical temperature for obtaining a eutectic mixture is got, namely, until a temperature greater than 1065° C. in the case of an oxidating reactive gas.

The second step 302 of the joining process consists in maintaining a treatment temperature ranging between the eutectic mixture forming temperature, namely 1065° C. and the copper melting temperature, namely 1083° C., with the simultaneous application of oxidating reactive gas.

Preferably, the treatment temperature of the step 302 is equal to 1075° C. $\pm/-2°$ C.

Preferably, the oxidating reactive gas applied during the treatment step 302 is formed by oxygen under partial pressure of 50 to 100 ppm, advantageously 70 ppm. According to an advantageous characteristic of the invention, the step 302 of the steady level of temperature, of the order of 1075° C. under a reactive gas atmosphere, lasts 2 to 4 min.

Finally, the ultimate cooling step 303 is achieved under a neutral atmosphere, preferably of nitrogen.

The Applicant has obtained fully satisfactory results in using heat treatment under a controlled atmosphere 30 in a continuous furnace with a flow speed of the order of 5 cm/min; and a complete treatment time (rise in temperature 301, steady temperature level 302, cooling 303) of about 45 min.

The method according to the present invention enables either the joining of a single copper sheet to a alumina or aluminum nitride substrate or the making of a sandwich structure, namely the bonding of copper sheets on either side of an alumina or aluminum nitride substrate.

Of course, the present invention is not limited to the above described embodiment, but can be extended to any alternative embodiments that conform to its spirit.

What is claimed is:

1. A method for the direct bonding of a copper sheet to a substrate made of electrically insulating material chosen from among alumina and aluminum nitride, said method consisting in the placing of a copper sheet on the substrate and in the heating of this set under a controlled atmosphere with the use, at least temporarily, of an oxidating reactive gas, at a temperature ranging between the temperature for the formation of a eutectic mixture, based on copper and the reactive gas, and the melting temperature of copper, and then in the cooling of the set, said method comprising the following steps:

i—cleaning the copper to remove traces of oxidation at its surface before placing the copper on the substrate ii—heating the copper/substrate set under a neutral atmosphere until a temperature is obtained which is greater than the eutectic mixture forming temperature, and iii—applying the oxidating reactive gas only after the obtaining of a temperature greater than the temperature for the formation of the eutectic mixture in such a way that this temperature is reached before any oxidation of the surface of the copper.

2. A method according to claim 1, wherein the copper sheet has a phosphorus content of less than 0.0015% by weight.

3. A method according to claim 1, wherein the copper sheet has an oxygen content of less than 0.0024% by weight.

4. A method according to claim 1, wherein the copper sheet has an oxygen content ranging between 0.0020% and 0.0024% by weight.

5. A method according to claim 1, wherein the substrate has a surface roughness of the order of 3.3±0.2 μm.

6. A method according to claim 1, wherein the substrate has a transition metal oxides content, notably an iron oxide content, of less than 0.08% by weight.

7. A method according to claim 1, wherein the copper/substrate set is heated up to a temperature of 1075° C. ±2° C.

8. A method according to claim 1, wherein the copper/substrate set is heated at a steady level of temperature of 1075°±2° C. for a period of 2 to 4 min.

9. A method according to claim 1, wherein the reactive gas applied after the obtaining of a temperature greater than the temperature of the eutectic mixture is formed by oxygen at a partial pressure of 50 to 100 ppm, preferably 70 ppm.

10. A method according to claim 1, wherein the cooling stage is done under a neutral atmosphere.

11. A method according to claim 1, wherein the neutral atmosphere is formed by nitrogen.

12. A method according to claim 1, wherein the copper cleaning step consists in the cleaning of said copper in a diluted solution of hydrochloric acid and then in the rinsing of the copper in de-ionized water.

* * * * *